(12) United States Patent
Fujihara

(10) Patent No.: US 9,766,279 B2
(45) Date of Patent: Sep. 19, 2017

(54) ELECTRONIC APPARATUS PREVENTING ERRONEOUS DETECTION OF SENSOR OUTPUT DUE TO AC LINE NOISE AND ERRONEOUS DETECTION PREVENTION METHOD

(71) Applicant: KYOCERA Document Solutions Inc., Osaka (JP)

(72) Inventor: Kensuke Fujihara, Osaka (JP)

(73) Assignee: KYOCERA Document Solutions Inc., Osaka (JP)

( * ) Notice: Subject to any disclaimer, the term of this patent is extended or adjusted under 35 U.S.C. 154(b) by 217 days.

(21) Appl. No.: 14/788,265

(22) Filed: Jun. 30, 2015

(65) Prior Publication Data

US 2015/0377944 A1    Dec. 31, 2015

(30) Foreign Application Priority Data

Jun. 30, 2014  (JP) ................................ 2014-133800
Jun. 30, 2014  (JP) ................................ 2014-133801

(51) Int. Cl.
*G01R 29/26*  (2006.01)
*G01R 35/00*  (2006.01)
(Continued)

(52) U.S. Cl.
CPC .............. *G01R 29/26* (2013.01); *G01R 35/00* (2013.01); *G03G 15/5004* (2013.01);
(Continued)

(58) Field of Classification Search
CPC ........ G01R 29/26; G01R 31/00; G01R 27/00; G01R 15/12; G01R 15/144; G01R 19/00;
(Continued)

(56) References Cited

U.S. PATENT DOCUMENTS

| 4,757,177 A | 7/1988 | Suzuki et al. |
| 2001/0022737 A1* | 9/2001 | Arai .................. H02M 3/33538 |
| | | 363/95 |

(Continued)

FOREIGN PATENT DOCUMENTS

| JP | S63-204336 A | 8/1988 |
| JP | H09-118472 A | 5/1997 |
| JP | 2005-252945 A | 9/2005 |

*Primary Examiner* — Huy Q Phan
*Assistant Examiner* — Raul Rios Russo
(74) *Attorney, Agent, or Firm* — Hawaii Patent Services; Nathaniel K. Fedde; Kenton N. Fedde

(57) ABSTRACT

Provided is an electronic apparatus that can prevent erroneous detection of a sensor output due to an AC line noise. A power supply circuit includes a noise filter, input rectifying smoothing circuit, converter circuit, and output smoothing circuit. The input rectifying smoothing circuit rectifies an input AC voltage passed through the noise filter to a pulsating flow and then smooth it. The converter circuit converts a DC voltage rectified and smoothed into a desired output voltage. The output smoothing circuit smoothes the convert output voltage to supply it to a control part. The noise determination part detects a noise that could not have been removed by the noise filter, as an AC line noise. The control part invalidates a detection signal outputted from the sensor for a previously set invalid period from the moment the AC line noise has been detected.

2 Claims, 6 Drawing Sheets

(51) Int. Cl.
  *G03G 21/00* (2006.01)
  *G03G 15/00* (2006.01)
  *G01R 15/12* (2006.01)
  *G01R 15/14* (2006.01)

(52) U.S. Cl.
  CPC .............. *G03G 15/80* (2013.01); *G03G 21/00* (2013.01); *G01R 15/12* (2013.01); *G01R 15/144* (2013.01)

(58) Field of Classification Search
  CPC ...... G01R 19/30; G01R 21/06; G01R 31/261; G01R 31/2623; G01L 21/30; G01N 27/62; G01N 27/64; H01J 41/00; H01J 41/02
  USPC ........... 324/76.11–76.83, 459, 600, 612, 613
  See application file for complete search history.

(56) References Cited

U.S. PATENT DOCUMENTS

| | | | |
|---|---|---|---|
| 2006/0104000 A1* | 5/2006 | Yuhara | H02H 9/046 361/93.1 |
| 2009/0074442 A1* | 3/2009 | Sano | G03G 15/5004 399/69 |
| 2009/0229343 A1* | 9/2009 | Ishiguro | G01N 27/4065 73/23.31 |
| 2010/0180665 A1* | 7/2010 | Abe | G01N 27/4065 73/23.31 |
| 2013/0027983 A1* | 1/2013 | Nate | H02M 3/335 363/21.01 |
| 2013/0147440 A1* | 6/2013 | Shiroyama | G01R 31/40 320/166 |

* cited by examiner

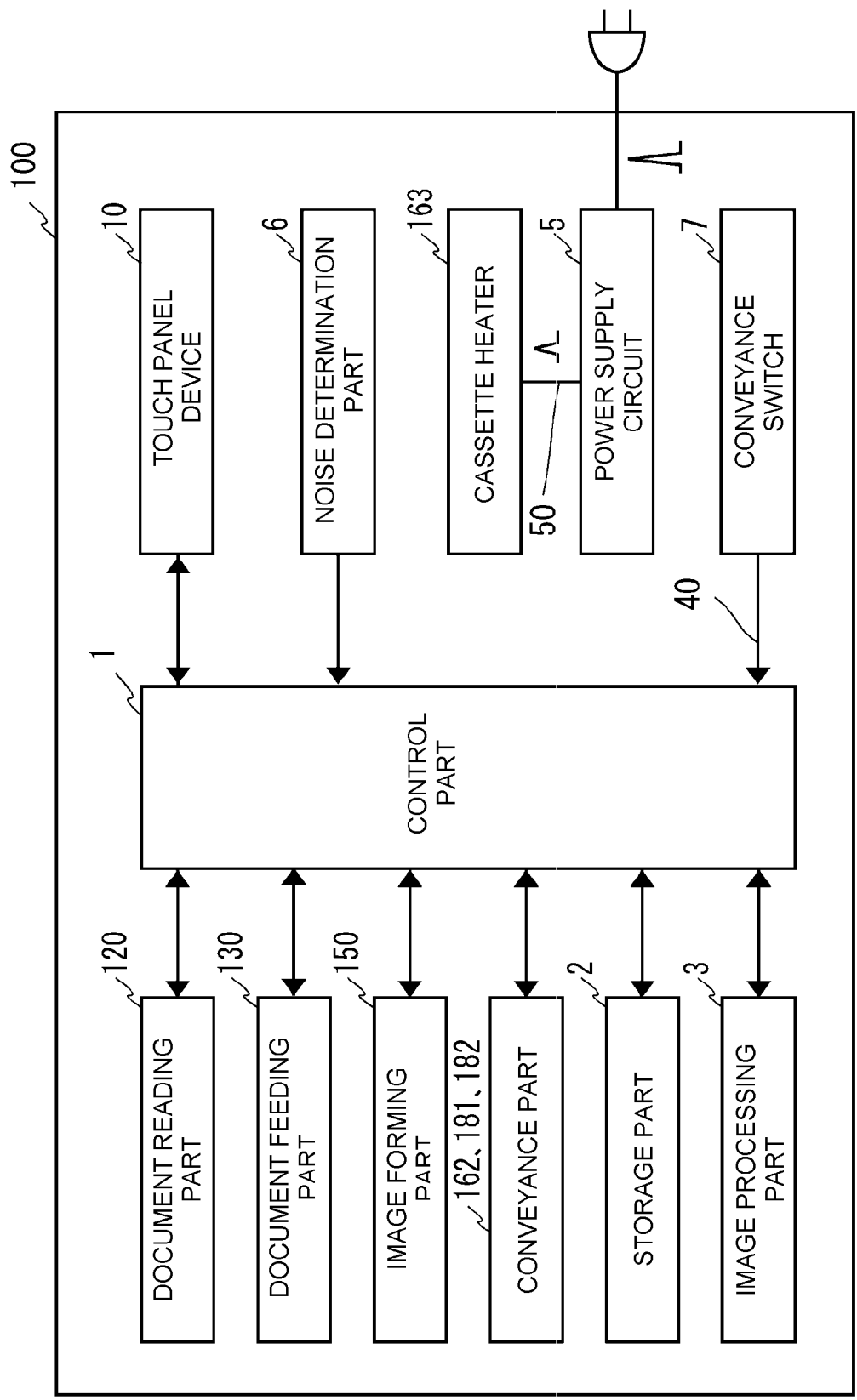

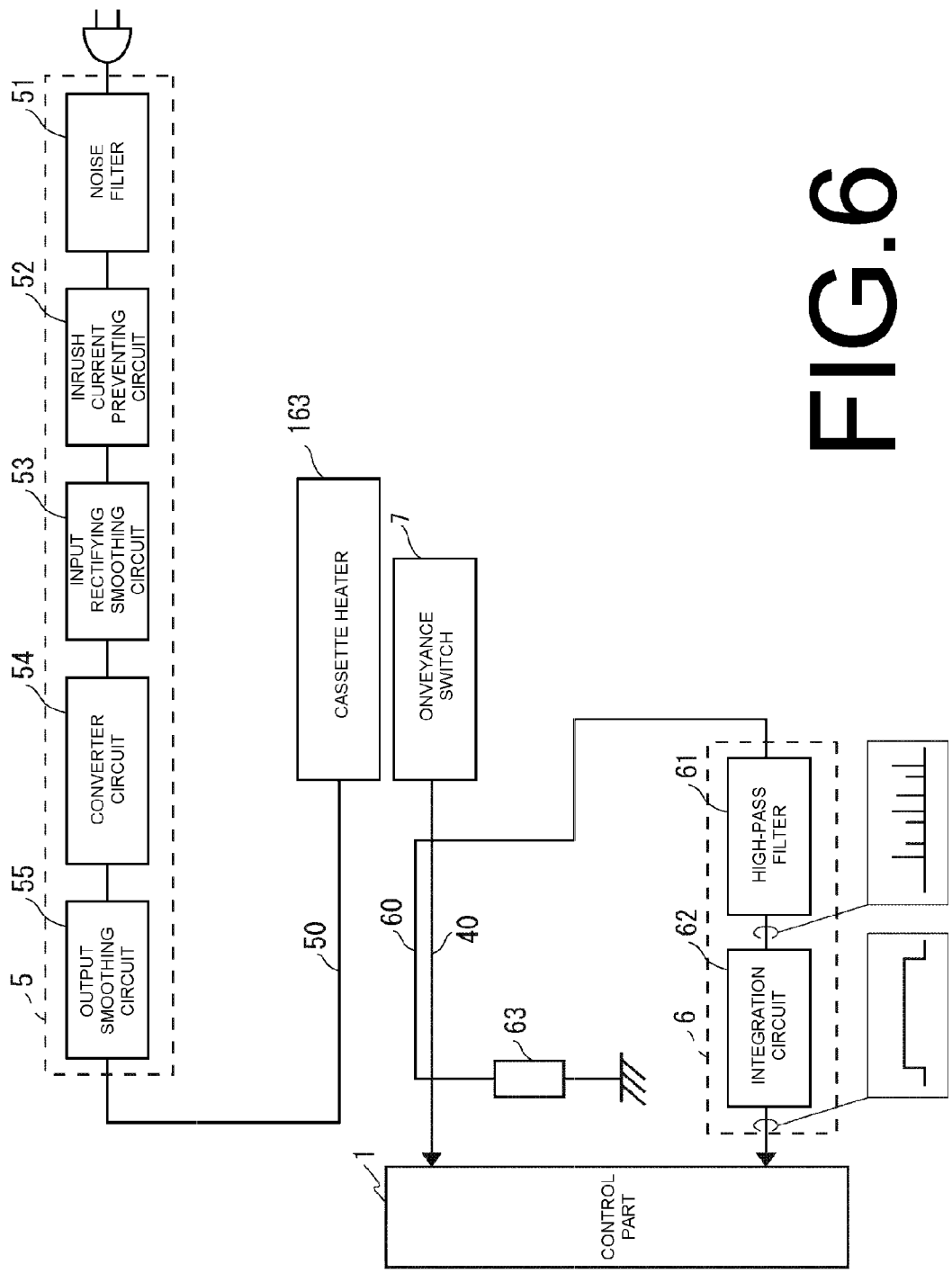

ELECTRONIC APPARATUS PREVENTING ERRONEOUS DETECTION OF SENSOR OUTPUT DUE TO AC LINE NOISE AND ERRONEOUS DETECTION PREVENTION METHOD

INCORPORATION BY REFERENCE

This application is based on and claims the benefit of priority from Japanese Patent Application No. 2014-133800 filed on Jun. 30, 2014, and Japanese Patent Application No. 2014-133801 filed on Jun. 30, 2014, the contents of which are hereby incorporated by reference.

BACKGROUND

The present disclosure relates to an electronic apparatus provided with a sensor, such as a photosensor, that prevents erroneous detection of a sensor output due to an ac line noise, and a method for preventing erroneous detection of a sensor output.

An image forming apparatus, which is an electronic apparatus, includes various sensors for detecting a recording sheet or operations, and is configured such that, in response to a detection signal outputted from such a sensor (hereinafter, referred to as a sensor output), a control part performs operation-control of the apparatus. To the control part, power is supplied from a commercial AC (Alternating Current) power supply through a power supply circuit, however, depending upon the situation of the commercial AC power supply, a noise may be generated in the power supply line. Such a noise influences the sensor output or the control part as an AC line noise, and there is the possibility that the control part may erroneously detect the sensor output. Then, in order to remove the AC line noise, the power supply circuit is provided with a noise filter composed of a capacitor, or the like, or a noise filter using a differential amplifying feature of a differential amplifier.

SUMMARY

One aspect of the present disclosure is an electronic apparatus provided with a sensor and a control part that performs control on the basis of a detection signal outputted from the sensor. The electronic apparatus includes a power supply circuit and a noise determination part. The power supply circuit supplies power to the control part. The noise determination part detects an AC line noise generated in a power supply line from the power supply circuit to the control part. The control part invalidates a detection signal outputted from the sensor for a previously set invalid period of time from the moment when the AC line noise has been detected by the noise determination part.

Another aspect of the present disclosure is also an electronic apparatus provided with a sensor and a control part that performs control on the basis of a detection signal outputted from the sensor. The electronic apparatus includes a heater, a power supply circuit, and a noise determination part. The power supply circuit supplies power to the heater. A noise detection line runs parallel with a power supply line from the power supply circuit to the heater. The noise determination part detects an AC line noise propagated from the power supply line to the noise detection line. The control part invalidates a detection signal outputted from the sensor for a previously set invalid period of time from the moment when the AC line noise has been detected by the noise determination part.

Another aspect of the present disclosure is an erroneous detection prevention method using an electronic apparatus provided with a sensor and a control part that performs control on the basis of a detection signal outputted from the sensor to prevent erroneous detection of an output of the sensor. With this method, power is supplied to the control part. In addition, an AC line noise generated in an power supply line from the power supply circuit to the control part is detected. In addition, from the moment when the AC line noise has been detected by the noise determination part, the control part invalidates a detection signal outputted from the sensor for a previously set invalid period of time.

BRIEF DESCRIPTION OF THE DRAWINGS

FIG. 5 is a block diagram illustrating a schematic configuration of the electronic apparatus shown in FIG. 4; and FIG. 6 is a block diagram illustrating a power supply circuit and a noise determination part that are indicated in FIG. 5.

DETAILED DESCRIPTION

[First Embodiment]

Next, a first embodiment of the present disclosure will be specifically explained with reference to the drawings.

Figure 1:
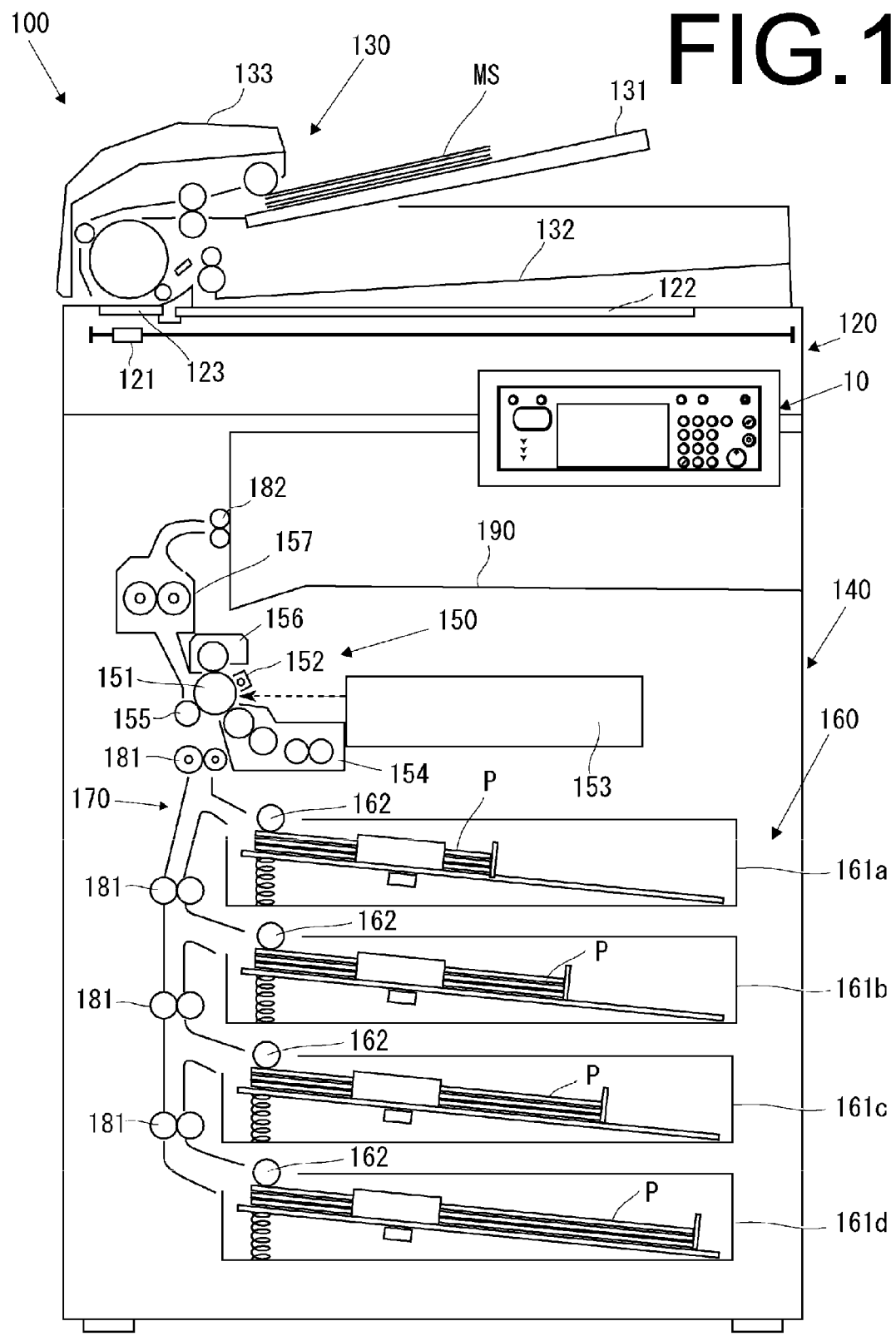
FIG. 1 is a schematic sectional view giving an example of configuration of an electronic apparatus according to a first embodiment of the present disclosure.

An electronic apparatus of the present embodiment is a image forming apparatus 100, such as a copying machine, and referring to FIG. 1, it includes a document reading part 120, a document feeding part 130, and a recording part 140. The document reading part 120 is disposed on top of the recording part 140, and the document feeding part 130 is disposed on top of the document reading part 120. On the front side of the image forming apparatus 100, there is disposed a touch panel device 10 for performing setting or an operation instruction for the image forming apparatus 100. The image forming apparatus 100 of the present disclosure is explained using a copying machine, however, needless to say, the image forming apparatus 1 of the present disclosure also refers to a scanner, a Multifunctional Peripheral (MFP), and the like.

The document reading part 120 includes a scanner 121, a platen glass 122, and a document reading slit 123. The scanner 121 has a light emitting means and a reading means. The document reading part 120 is movable in a direction of conveyance of a document MS by the document feeding part 130. The platen glass 122 is a document table formed of a transparent material. The document reading slit 123 has a slit that is formed in a direction orthogonal to the direction of conveyance of a document MS by the document feeding part 130.

When reading a document MS placed on the platen glass 122, the scanner 121 is moved to a position opposed to the platen glass 122. The scanner 121 reads the document MS placed on the platen glass 122 for acquiring image data while scanning the document MS. The scanner 121 outputs the acquired image data to the recording part 140. Further, when reading a document MS carried by the document feeding part 130, the scanner 121 is moved to a position opposed to the document reading slit 123. The scanner 121 reads the document MS through the document reading slit 123 in synchronization with the document carrying operation of the document feeding part 130 to acquire image data. The scanner 121 outputs the acquired image data to the recording part 40.

The document feeding part 130 includes a document mounting part 131, a document discharge part 132, and a document carrying mechanism 133. The documents MS placed on the document mounting part 131 are fed sheet by sheet in turn by the document carrying mechanism 133. The document MS is carried to a position opposed to the document reading slit 123 in the document reading part 120, and thereafter discharged into the document discharge part 132. The document feeding part 130 is configured to be tiltable. By bringing the document feeding part 130 upward, the top face of the platen glass 122 can be opened.

The recording part 140 includes an image forming part 150. Further, the recording part 140 includes a paper feeding part 160, a carrying passage 170, conveyance rollers 181, discharge rollers 182, and a delivery tray 190.

The paper feeding part 160 includes a plurality of paper feeding cassettes 161a to 161d for storing recording sheets P, and a feed roller 162 for feeding the recording sheets P one by one from the respective paper feeding cassettes 161a to 161d to the carrying passage 170. The feed roller 162, the conveyance rollers 181, and the discharge rollers 182 function as a conveyance part to convey the recording sheet P. The recording sheet P fed by the feed roller 162 into the paper carrying passage 170 is conveyed by the conveyance rollers 181 into the image forming part 150. The recording sheet P that has been provided with a record by the image forming part 150 is guided by the discharge rollers 182 to be delivered to the delivery tray 190.

The image forming part 150 includes a photosensitive drum 151, an electrifying part 152, an exposure part 153, a developing part 154, a transfer part 155, a cleaning part 156, and a fixing part 157. The exposure part 153 is an optical unit provided with a laser apparatus, a mirror, and the like. The exposure part 153 outputs a laser beam on the basis of the image data to expose the photosensitive drum 151 that has been electrified by the electrifying part 152. Thereby, an electrostatic latent image is formed on the surface of the photosensitive drum 151. The developing part 154 is a developing unit that uses toner for developing the electrostatic latent image formed on the photosensitive drum 151. The developing part 154 causes a toner image based on the electrostatic latent image to be formed on the photosensitive drum 151. The transfer part 155 causes the toner image formed on the photosensitive drum 151 by the developing part 154 to be transferred onto the recording paper P. The fixing part 157 causes the toner image to be fixed on the recording paper P by heating the recording paper P onto which the toner image has been transferred by the transfer part 155.

Next, an example of hardware configuration of the image forming apparatus 100 will be explained with reference to FIG. 2.

The touch panel device 10, the document reading part 120, the document feeding part 130, the image forming part 150, and the conveyance part (the feed roller 162, the conveyance rollers 181, and the discharge rollers 182) are connected to the control part 1. The respective parts are operation-controlled by the control part 1. In addition, to the control part 1, the storage part 2, the image processing part 3, and the sensor 4 are connected.

The control part 1 is an information processing part, such as a microcomputer, that is provided with a non-transitory recording medium. The recording medium stores a control program for performing operation-control of the image forming apparatus 100. The control part 1 reads out the control program stored in the recording medium to expand the control program. Thereby, the control part 1 controls the entire apparatus in response to apiece of prescribed instruction information inputted from the touch panel device 10 or a detection signal outputted from the sensor 4.

The storage part 2 is a recording medium that is non-transitory. The storage part 2 stores image data that has been acquired by the document reading part 120 reading a document.

The image processing part 3 is a means for performing prescribed image processing on the image data, for example, enlargement/reduction processing, or image improvement processing, such as density adjustment or gradation adjustment.

The sensor 4 is, for example, a photosensor that detects the recording sheet P conveyed by the conveyance part (the feed roller 162, the conveyance rollers 181, and the discharge rollers 182). Alternatively, the sensor 4 may be, for example, a photosensor for detecting the size of a document MS in the document reading part 120.

In addition, the image forming apparatus 100 includes a power supply circuit 5 that supplies power to the control part 1, and a noise determination part 6 that detects an AC line noise on the power supply line.

Figure 3:
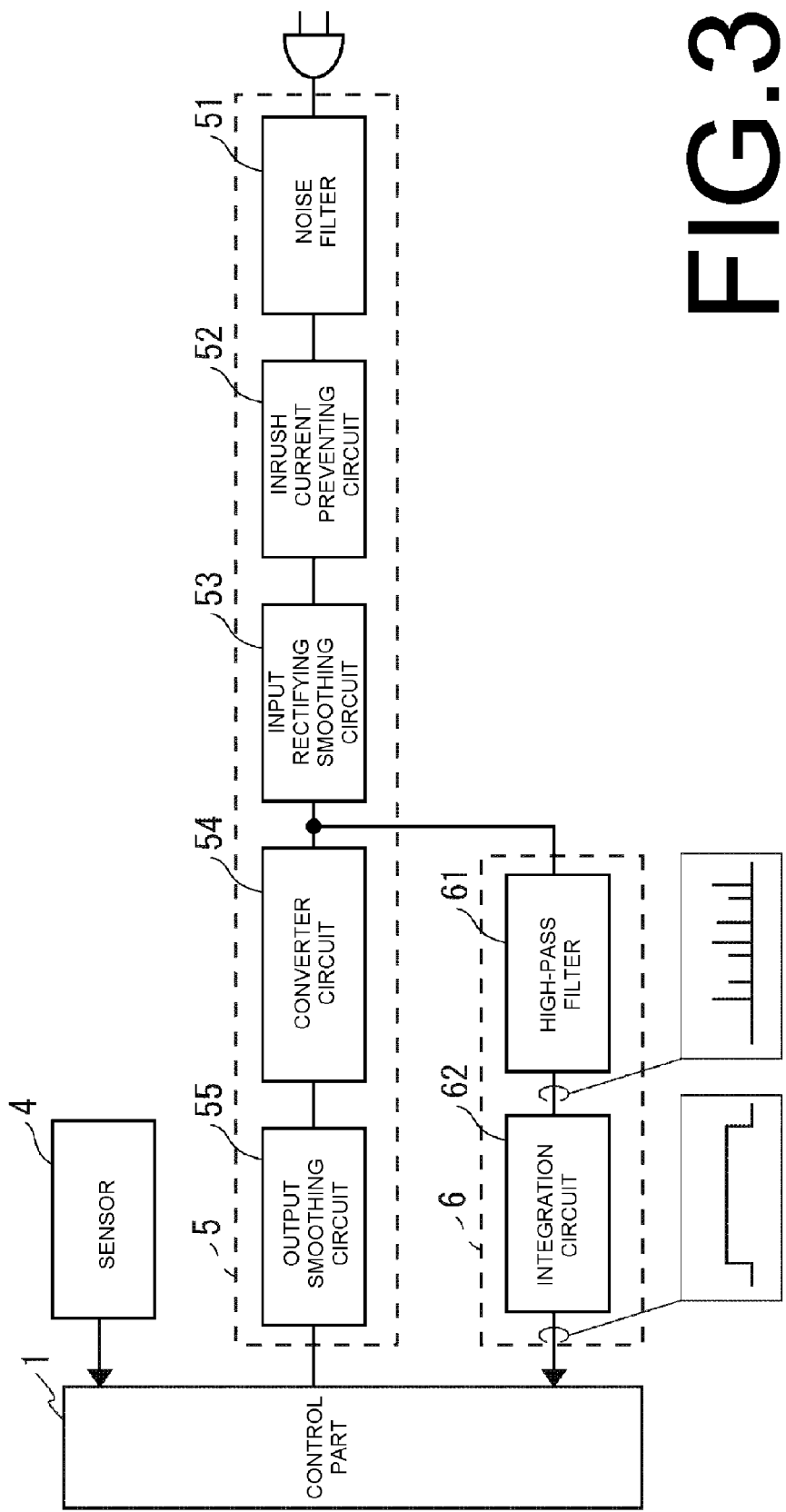
FIG. 3 is a block diagram illustrating a power supply circuit and a noise determination part which are indicated in FIG. 2.

Referring to FIG. 3, the power supply circuit 5 includes a noise filter 51, an inrush current preventing circuit 52, an input rectifying smoothing circuit 53, a converter circuit 54, and an output smoothing circuit 55. The noise filter 51 is a circuit composed of a capacitor, or the like, that removes a noise superimposed on the input AC voltage inputted from a commercial AC power supply. The inrush current preventing circuit 52 is provided at the rear stage of the noise filter 51, being a circuit composed of a resistor, a thermistor, or the like, that suppresses an inrush current when power is turned on. The input rectifying smoothing circuit 53 is provided at the rear stage of the inrush current preventing circuit 52, being a circuit composed of a diode bridge, a smooth capacitor, or the like, that rectifies the input AC voltage to a pulsating flow and then smoothes the pulsating flow. The converter circuit 54 is provided at the rear stage of the input rectifying smoothing circuit 53, being a circuit that converts a DC (Direct Current) voltage rectified and smoothed by the input rectifying smoothing circuit 53 into a desired output voltage. The output smoothing circuit 55 is provided at the rear stage of the converter circuit 54, being a circuit composed of a smoothing capacitor, or the like, that smoothes an output voltage converted by the converter circuit 54.

The noise determination part 6 includes a high-pass filter 61 and an integration circuit 62. An AC line noise, which is a high frequency noise, is difficult to be thoroughly removed with a low-cost filter. Then, a high-pass filter 61 is used to detect, from an output of the input rectifying smoothing circuit 53, an AC line noise that could not have been removed by the noise filter 51. In other words, the AC line noise, which is a high frequency noise, is passed through the high-pass filter 61. Then, the integration circuit 62 integrates the AC line noise passed through the high-pass filter 61, thereby generating a pulse signal, which is at a high level for a prescribed time period from the moment of detection of the AC line noise, and inputs the generated pulse signal to the control part 1 as a sensor output invalid signal.

While the sensor output invalid signal is at a high level, in other words, for a previously set invalid period of time from the moment when the AC line noise has been detected, the control part 1 invalidates the detection signal outputted from the sensor 4. Generally, the AC line noise is often continuously generated for a short period of time, and such a continuously generated AC line noise influences the sensor output or the control part 1, the sensor output being erroneously detected. Then, in the present embodiment, for a previously set invalid period of time from the moment when the AC line noise has been detected, the detection signal outputted from the sensor 4 is invalidated, and thus the sensor output or the control part 1 will not be influenced by the continuously generated AC line noise, thereby erroneous detection of a sensor output due to an AC line noise being prevented.

As explained above, the present embodiment is the image forming apparatus 100, which is an electronic apparatus provided with the sensor 4, and the control part 1 that performs control on the basis of a detection signal outputted from the sensor 4, including the power supply circuit 5 that supplies power to the control part 1, and the noise determination part 6 that detects an AC line noise generated on the power supply line from the power supply circuit 5 to the control part 1, the control part 1 invalidating a detection signal outputted from the sensor 4 for a previously set invalid period of time from the moment when the AC line noise has been detected by the noise determination part 6.

With this configuration, an AC line noise that could not have been removed by the noise filter 51 in the power supply circuit 5 is detected, and for a previously set invalid period of time from the moment when the AC line noise has been detected, the sensor output is invalidated, thereby the sensor output or the control part 1 being not influenced by a continuously generated AC line noise, whereby erroneous detection of an sensor output due to an AC line noise can be prevented.

Further, in the present embodiment, the power supply circuit 5 includes the noise filter 51 that removes a noise superimposed on the input AC voltage; the input rectifying smoothing circuit 53 that rectifies the input AC voltage passed through the noise filter 51 to a pulsating flow and then smoothes the pulsating flow; the converter circuit 54 that converts the DC voltage rectified and smoothed by the input rectifying smoothing circuit 53 into a desired output voltage; and the output smoothing circuit 55 that smoothes the output voltage converted by the converter circuit 54 to supply it to the control part 1, the noise determination part 6 detects, from an output of the input rectifying smoothing circuit 53, a noise that could not have been removed by the noise filter 51, as an AC line noise.

With this configuration, a noise that could not have been removed by the noise filter 51 can be detected as an AC line noise, whereby erroneous detection of a sensor output due to an AC line noise can be prevented, and thus a low-cost noise filter 51 can be used with the power supply circuit 5.

More specifically explaining, a high frequency noise, such as an AC line noise, is difficult to be thoroughly removed with a low-cost noise filter, and therefore there has been presented a problem that the sensor output is erroneously detected due to an AC line noise that has not been removed by a noise filter in the power supply circuit.

Contrarily to this, in the first embodiment, there can be provided an electronic apparatus with which the above problem of the prior art has been solved, and that can prevent erroneous detection of a sensor output due to an AC line noise.

In other words, according to the present embodiment, there is exerted an advantage that an AC line noise that could not have been removed with a noise filter in the power supply circuit is detected, and the sensor output is invalidated for a previously set invalid period of time from the moment when the AC line noise has been detected, whereby erroneous detection of a sensor output due to an AC line noise can be prevented.

[Second Embodiment]

A second embodiment of the present disclosure relates to an electronic apparatus provided with a heater and a sensor, such as a photosensor.

Figure 4:
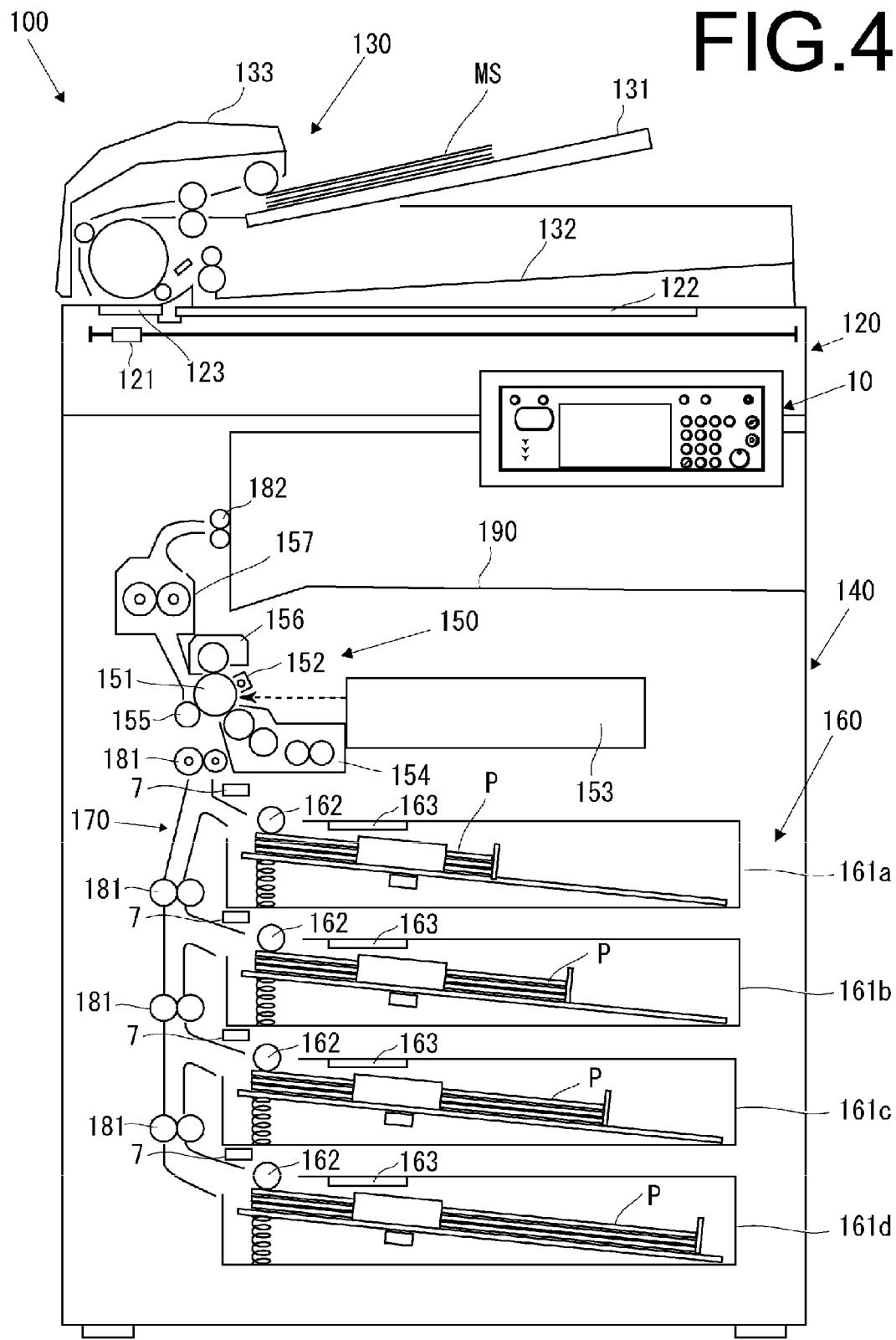
FIG. 4 is a schematic sectional view giving an example of configuration of an electronic apparatus according to a second embodiment of the present disclosure.

Referring to FIG. 4, an electronic apparatus of the present embodiment is an image forming apparatus 100, such as a copying machine, and the same symbol as that in FIG. 1 indicates the same component.

In the second embodiment, the paper feeding part 160 includes a plurality of paper feeding cassettes 161a to 161d for storing recording sheets P; a feed roller 162 for feeding the recording sheets P one by one from the respective paper feeding cassettes 161a to 161d to the carrying passage 170; a cassette heater 163 for dehumidifying the recording sheets P stored in the respective paper feeding cassettes 161a to 161d; and a conveyance switch 7 for detecting a recording sheet P fed out from the respective paper feeding cassettes 161a to 161d by the feed roller 162. The feed roller 162, the conveyance rollers 181, and the discharge rollers 182 function as a conveyance part to convey the recording sheet P. The recording sheet P that has been fed out from the respective paper feeding cassettes 161a to 161d by the feed roller 162 is detected by the conveyance switch 7, and is conveyed by the conveyance rollers 181 to the image forming part 150 at a prescribed timing. As the conveyance switch 7, a photosensor is used. The recording sheet P that has been provided with a record by the image forming part 150 is guided by the discharge rollers 182 to be delivered to the delivery tray 190.

Next, an example of hardware configuration of the image forming apparatus 100 according to the second embodiment will be explained with reference to FIG. 5.

Figure 2:
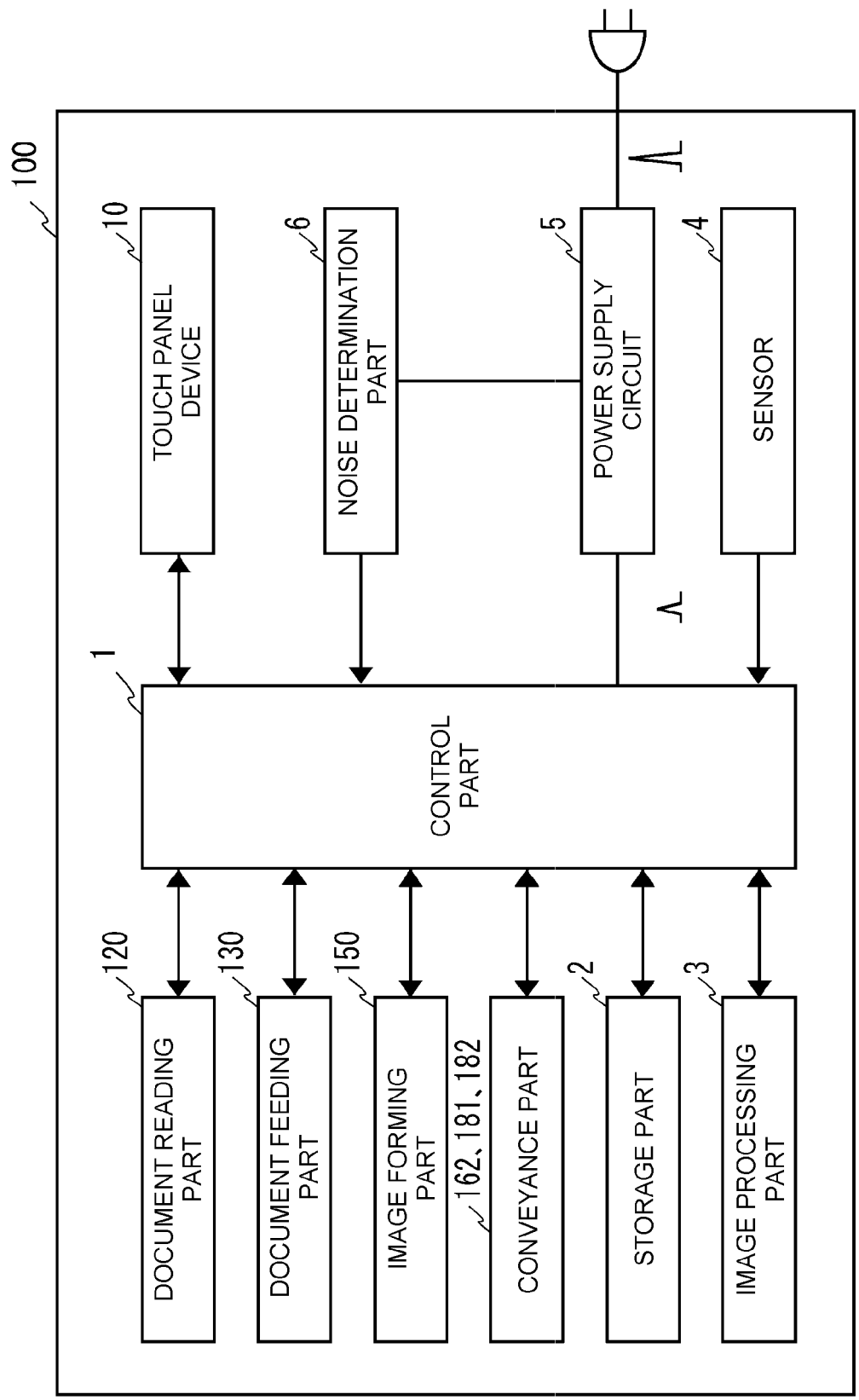
FIG. 2 is a block diagram illustrating a schematic configuration of the electronic apparatus shown in FIG. 1.

In FIG. 5, the same symbol as that in FIG. 2 indicates the same component.

To the control part 1, a storage part 2, an image processing part 3, and a noise determination part 6 are connected.

In the present embodiment, the control part 1 performs conveyance control of a recording sheet P and image formation control in response to a piece of prescribed instruction information inputted from the touch panel device 10 or a detection signal outputted from the conveyance switch 7.

The noise determination part 6 detects an AC line noise generated in a power supply line 50 that supplies power from the power supply circuit 5 for the cassette heater 163 to the cassette heater 163.

Referring to FIG. 6, in the present embodiment, the power supply circuit 5 includes a noise filter 51, an inrush current preventing circuit 52, an input rectifying smoothing circuit 53, a converter circuit 54, and an output smoothing circuit 55. Also in FIG. 6, the same symbol as that in FIG. 3 indicates the same component.

The noise filter 51 is a circuit composed of a capacitor, or the like, that removes a noise superimposed on the input AC voltage inputted from a commercial AC power supply. The inrush current preventing circuit 52 is provided at the rear stage of the noise filter 51, being a circuit composed of a resistor, a thermistor, or the like, that suppresses an inrush current when power is turned on. The input rectifying smoothing circuit 53 is provided at the rear stage of the inrush current preventing circuit 52, being a circuit composed of a diode bridge, a smooth capacitor, or the like, that rectifies the input AC voltage to a pulsating flow and then smoothes the pulsating flow. The converter circuit 54 is provided at the rear stage of the input rectifying smoothing circuit 53, being a circuit that converts a DC voltage rectified and smoothed by the input rectifying smoothing circuit 53 into a desired output voltage. The output smoothing circuit 55 is provided at the rear stage of the converter circuit 54, being a circuit composed of a smoothing capacitor, or the like, that smoothes an output voltage converted by the converter circuit 54.

To the noise determination part 6, as shown in FIG. 6, there is connected a noise detection line 60 that runs parallel with the power supply line 50 for supplying power from the power supply circuit 5 to the cassette heater 163. By means of a resistor 63 interposed between the noise detection line 60 and the ground terminal, the noise detection line 60 is set at an impedance higher than that of the sensor output line 40 for transmitting a sensor output of the conveyance switch 7 to the control part 1. In addition, the noise detection line 60 is provided such that it runs parallel with the power supply line 50 in a position closer to the sensor output line 40. Thereby, if an AC line noise that influences the sensor output line 40 is generated in the power supply line 50, the AC line noise is reliably propagated also to the noise detection line 60 from the power supply line 50.

The noise determination part 6 includes a high-pass filter 61 and an integration circuit 62. An AC line noise, which is a high frequency noise, is difficult to be thoroughly removed with a low-cost filter. Then, a high-pass filter 61 is used to detect an AC line noise that has been propagated from the power supply line 50 to the noise detection line 60. In other words, the AC line noise, which is a high frequency noise, is passed through the high-pass filter 61. Then, the integration circuit 62 integrates the AC line noise passed through the high-pass filter 61, thereby generating a pulse signal, which is at a high level for a prescribed time period from the moment of detection of the AC line noise, and inputs the generated pulse signal to the control part 1 as a sensor output invalid signal.

While the sensor output invalid signal is at a high level, in other words, for a previously set invalid period of time from the moment when the AC line noise has been detected, the control part 1 invalidates the detection signal outputted from the sensor 4. Generally, the AC line noise is often continuously generated for a short period of time, and such a continuously generated AC line noise influences a sensor output or the control part 1, the sensor output being erroneously detected. Then, in the present embodiment, for a previously set invalid period of time from the moment when the AC line noise has been detected, the detection signal outputted from the sensor 4 is invalidated, and thus the sensor output or the control part 1 will not be influenced by the continuously generated AC line noise, thereby erroneous detection of a sensor output due to an AC line noise being prevented.

As explained above, the present embodiment is the image forming apparatus 100, which is an electronic apparatus provided with the conveyance switch 7, which is a sensor, and the control part 1 that performs control on the basis of a detection signal outputted from the conveyance switch 7, including the cassette heater 163, the power supply circuit 5 that supplies power to the cassette heater 163, the noise detection line 60 that runs parallel with the power supply line 50 from the power supply circuit 5 to the cassette heater 163, and the noise determination part 6 that detects an AC line noise propagated from the power supply line 50 to the noise detection line 60, the control part 1 invalidating a detection signal outputted from the conveyance switch 7 for a previously set invalid period of time from the moment when the AC line noise has been detected by the noise determination part 6.

With this configuration, an AC line noise that is generated in the power supply line 50 for supplying power to the conveyance switch 7 is detected, and for a previously set invalid period of time from the moment when the AC line noise has been detected, the sensor output is invalidated, thereby the sensor output being not influenced by a continuously generated AC line noise, whereby erroneous detection of an sensor output due to an AC line noise can be prevented.

Further, in the present embodiment, the noise detection line 60 is set at an impedance higher than that of the sensor output line 40 for the conveyance switch 7.

With this configuration, an AC line noise that influences the sensor output line 40 for the conveyance switch 7 can be made reliably propagated to the noise detection line 60, whereby the AC line noise can be more reliably detected.

More specifically describing, it is known that, with an image forming apparatus, which is an electronic apparatus, if a recording sheet containing a moisture is used, the paper feeding system will not properly function, thereby the frequency of occurrence of jam being increased. Then, it has been practiced that a paper feeding cassette is provided with a cassette heater to dehumidify the recording sheets stored in the paper feeding cassette.

However, to the cassette heater, power is supplied from a commercial AC power supply through a power supply circuit, and depending upon the situation of the commercial AC power supply, a noise may be generated in the power supply line. This noise influences the sensor output line for the conveyance switch (a sensor, such as a photosensor, for detecting feed of a recording sheet from the paper feeding cassette) as an AC line noise, and there is the possibility that the sensor output may be erroneously detected.

Although a measure for preventing the power supply line and the sensor output line from running parallel with each other can be taken, in the case where space saving is to be made, it is difficult to secure a sufficient distance between the power supply line and the sensor output line.

In addition, although it can be considered that the power supply circuit or the power supply line is provided with a noise filter composed of a capacitor, or the like, or a noise filter using a differential amplification feature of a differential amplifier to thereby remove an AC line noise, it is difficult to thoroughly remove a high frequency noise, such as an AC line noise, with a low-cost noise filter.

In the second embodiment, there can be provided an electronic apparatus with which the above problem of the prior art has been solved, and that can prevent erroneous detection of a sensor output due to an AC line noise generated in the power supply line for supplying power to the heater.

In other words, according to the present embodiment, there is exerted an advantage that an AC line noise that is generated in the power supply line for supplying power to the heater is detected, and the sensor output is invalidated for a previously set invalid period of time from the moment when the AC line noise has been detected, whereby erroneous detection of a sensor output due to an AC line noise can be prevented.

Further, in the above-described first embodiment and second embodiment, the noise determination part 6 includes the high-pass filter 61 that functions as an AC line noise detection circuit for detecting an AC line noise, and the integration circuit 62 that functions as an invalid signal generating circuit for generating a sensor output invalid signal to be turned on for the invalid period of time from the moment when the AC line noise has been detected by the high-pass filter 61.

This configuration allows an AC line noise to be detected with an inexpensive system.

In the above embodiments, the noise determination part 6 is configured to include the high-pass filter 61 and the integration circuit 62, however, between the high-pass filter 61 and the integration circuit 62, a diode may be interposed. With this configuration, if an AC line noise appears on both polarity sides of the output from the high-pass filter 61, the AC line noise on one polarity side thereof can be removed by the diode before being inputted to the integration circuit 62. Therefore, occurrence of such a phenomenon as that, in the integration circuit 62, an integral signal is subtracted (cancelled) by an AC line noise on the opposite polarity side can be prevented, whereby a preferable pulse signal can be outputted.

The present disclosure is not limited to the above respective embodiments. In addition, it is obvious that the respective embodiments can be appropriately altered within the scope of the technical concept of the present disclosure. In addition, the number, location, geometry, and the like, of the above components are not limited to those mentioned in the above embodiments, and may be adapted to be a number, location, geometry, and the like, that are appropriate for embodying the present disclosure. In the respective figures, the same component is provided with the same symbol.

What is claimed is:

1. An electronic apparatus provided with a sensor and a control part, the control part performing control on the basis of a detection signal outputted from the sensor, the electronic apparatus comprising:
    a power supply circuit, supplying power to the control part, and a noise determination part, detecting an AC (Alternating Current) line noise generated in a power supply line from the power supply circuit to the control part,
    the control part invalidating a detection signal outputted from the sensor for a previously set invalid period of time from the moment when the AC line noise having been detected by the noise determination part, wherein the power supply circuit includes
    a noise filter that removes a noise superimposed on an input AC voltage,
    an input rectifying smoothing circuit that rectifies the input AC voltage passed through the noise filter to a pulsating flow and then smooths the pulsating flow,
    a converter circuit that converts a DC (Direct Current) voltage rectified and smoothed by the input rectifying smoothing circuit into a desired output voltage, and an output smoothing circuit that smooths the output voltage converted by the converter circuit to supply it to the control part,
    the noise determination part detecting, from an output of the input rectifying smoothing circuit, a noise that could not have been removed by the noise filter, as the AC line noise.

2. An erroneous detection prevention method using an electronic apparatus provided with a sensor and a control part, the control part performing control on the basis of a detection signal outputted from the sensor to prevent erroneous detection of an output of the sensor, the erroneous detection prevention method comprising:
    removing, using a noise filter, a noise superimposed on an input AC (Alternating Current) voltage, and then
    rectifying the input AC voltage to a pulsating flow and then smoothing the pulsating flow, thereby providing a DC (Direct Current) voltage,
    converting the DC voltage into a desired output voltage, smoothing the desired output voltage and supplying the smoothed desired output voltage as power to the control part,
    detecting an AC line noise generated in a power supply line from the power supply circuit to the control part, wherein the AC line noise is a noise that could not have been removed by the noise filter, and
    using the control part to invalidate a detection signal outputted from the sensor for a previously set invalid period from the moment when the AC line noise having been detected by the noise determination part.

* * * * *